(12) United States Patent
Balakrishnan et al.

(10) Patent No.: US 12,019,406 B2
(45) Date of Patent: *Jun. 25, 2024

(54) USING TIME-TO-DIGITAL CONVERTERS TO DELAY SIGNALS WITH HIGH ACCURACY AND LARGE RANGE

(71) Applicant: Skyworks Solutions, Inc., Irvine, CA (US)

(72) Inventors: Krishnan Balakrishnan, Austin, TX (US); James David Barnette, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/990,147

(22) Filed: Nov. 18, 2022

(65) Prior Publication Data

US 2023/0185249 A1    Jun. 15, 2023

Related U.S. Application Data

(63) Continuation of application No. 16/428,288, filed on May 31, 2019, now Pat. No. 11,526,135.

(51) Int. Cl.
| | | |
|---|---|---|
| *G04F 10/00* | (2006.01) | |
| *G06F 1/08* | (2006.01) | |
| *H03K 5/00* | (2006.01) | |
| *H03L 7/081* | (2006.01) | |
| *H03L 7/093* | (2006.01) | |

(52) U.S. Cl.
CPC .............. *G04F 10/005* (2013.01); *G06F 1/08* (2013.01); *H03K 5/00* (2013.01); *H03L 7/0814* (2013.01); *H03K 2005/00058* (2013.01); *H03L 7/093* (2013.01)

(58) Field of Classification Search
CPC .......... G04F 10/005; G06F 1/08; H03K 5/00; H03K 2005/00013; H03K 2005/00019; H03K 2005/00026; H03K 2005/00058; H03K 2005/00078; H03K 2005/00084; H03K 2005/00097; H03K 2005/0011; H03L 7/0814; H03L 7/093
See application file for complete search history.

(56) References Cited

U.S. PATENT DOCUMENTS

| | | |
|---|---|---|
| 9,923,710 B2 | 3/2018 | Chan et al. |
| 10,067,478 B1 | 9/2018 | Kolar Ranganathan |
| 10,594,323 B2 * | 3/2020 | Candler .................. H03L 1/00 |
| 10,608,649 B1 | 3/2020 | Kayakumar et al. |
| 10,651,862 B1 | 5/2020 | Barnette et al. |
| 10,693,475 B1 | 6/2020 | Gong et al. |
| 10,727,844 B1 | 7/2020 | Gong et al. |
| 10,727,845 B1 | 7/2020 | Balakrishnan et al. |
| 10,819,354 B2 | 10/2020 | Jayakumar et al. |

(Continued)

*Primary Examiner* — Diana J. Cheng
(74) *Attorney, Agent, or Firm* — Knobbe, Martens, Olson & Bear, LLP

(57) ABSTRACT

A system delays input clock signals using time-to-digital converters (TDCs) to convert edges or the clock signals to digital values and storing the digital values in a memory. The digital values are retrieved from the memory based on a desired delay. A time counter used by the TDCs to determine the edges is also used determine the delay. The accuracy and range of the delay depends on the time counter and size of the memory.

18 Claims, 4 Drawing Sheets

(56) References Cited

U.S. PATENT DOCUMENTS

| | | |
|---|---|---|
| 10,826,507 B1 | 11/2020 | Gong et al. |
| 11,038,521 B1 | 6/2021 | Rafi et al. |
| 11,283,459 B1 | 3/2022 | Monk et al. |
| 11,526,135 B2 | 12/2022 | Balakrishnan et al. |
| 11,563,441 B2 | 1/2023 | Monk et al. |
| 2012/0313803 A1* | 12/2012 | Dosho ............... G04F 10/005 341/166 |
| 2018/0315369 A1 | 11/2018 | Pyun et al. |
| 2019/0007055 A1* | 1/2019 | Nelson ................ H03K 5/133 |
| 2020/0379412 A1 | 12/2020 | Balakrishnan et al. |

* cited by examiner

USING TIME-TO-DIGITAL CONVERTERS TO DELAY SIGNALS WITH HIGH ACCURACY AND LARGE RANGE

CROSS-REFERENCE TO RELATED APPLICATIONS

This application is a continuation of U.S. application Ser. No. 16/428,288, filed May 31, 2019, entitled "USING TIME-TO-DIGITAL CONVERTERS TO DELAY SIGNALS WITH HIGH ACCURACY AND LARGE RANGE." Each of the foregoing applications are incorporated herein by reference in their entirety.

BACKGROUND

Field of the Invention

Description of the Related Art

Phase-locked loops (PLLs) are used to generate clock signals for a variety of applications. Some applications require PLL's to accept a wide frequency range of clock inputs (as low, e.g., as 0.5 Hz). To maintain fidelity at the output of the PLL, the PLL analyzes the quality (frequency and phase) of reference clock inputs, choosing the best possible input to be used by the PLL, and discarding lower quality and degraded inputs. For example, a PLL may receive two reference clock signals and select the best one of the two inputs as the reference clock signal. If one of the reference clock signals fails or degrades, the PLL can switch to use of the other reference clock signal. In order to prevent lower quality inputs from adversely affecting the PLL output, the input signals can be buffered (delayed) while their quality is being analyzed.

Input signals can be delayed by a programmable amount using analog delays by passing the signal through a string of inverters that act as a delay chain, and tapping off the required signal based on the programmed delay. Delaying input signals using analog delays can provide very high resolution but such an approach cannot accommodate large delay ranges (e.g., greater than 4 seconds). Input signals can also be digitized by sampling it with a fast clock, and then delayed by a programmable amount of sampling clock periods by passing the signal through a string of flip-flop's that act as a delay chain, and tapping off the required signal based on the programmed delay. Delaying signals using digital delays can provide large ranges but lacks high resolution.

SUMMARY OF EMBODIMENTS OF THE INVENTION

It would be desirable to provide a PLL that has both a large delay range and high resolution. Accordingly, in an embodiment, a method of operating a phase-locked loop includes receiving a first edge of a clock signal, converting the first edge to a first digital value, and storing a first value corresponding to the first digital value in a memory. The method further includes receiving a second edge of the clock signal, converting the second edge to a second digital value, and storing a second value corresponding to the second digital value in the memory. The first value is dequeued from the memory a predetermined delay after occurrence of the first edge and the second value is dequeued from the memory the predetermined delay after occurrence of the second edge.

In another embodiment, a phase-locked loop includes a first time-to-digital converter coupled to a first clock signal and configured to convert a first edge of the first clock signal to a first digital value and to convert a second edge of the first clock signal to a second digital value. A memory is coupled to the first time-to-digital converter and stores a first value corresponding to the first digital value in a queue and stores a second value corresponding to the second digital value in the queue. The memory is controlled to dequeue the first value a predetermined delay after occurrence of the first edge and to dequeue the second value the predetermined delay after occurrence of the second edge.

In another embodiment, a method includes converting a first edge of a first reference clock signal to a first digital value and storing a first value corresponding to the first digital value in a first queue. The method further includes converting a first edge of a second reference clock signal to a second digital value and storing a second value corresponding to the second digital value in a second queue. The method further includes converting a first edge of a feedback clock signal to a third digital value and storing a third stored value corresponding to the third digital value in a third queue. The first value is dequeued from the first queue a predetermined delay after the first edge of the first reference clock signal. The second value is dequeued from the second queue the predetermined delay after the first edge of the second reference clock signal and the third stored value is dequeued from the third queue the predetermined delay after the first edge of the feedback clock signal. A multiplexer selects as a multiplexer output signal a first multiplexer input signal based on the first value or a second multiplexer input signal based on the second value and supplies the multiplexer output signal to a phase and frequency detector.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
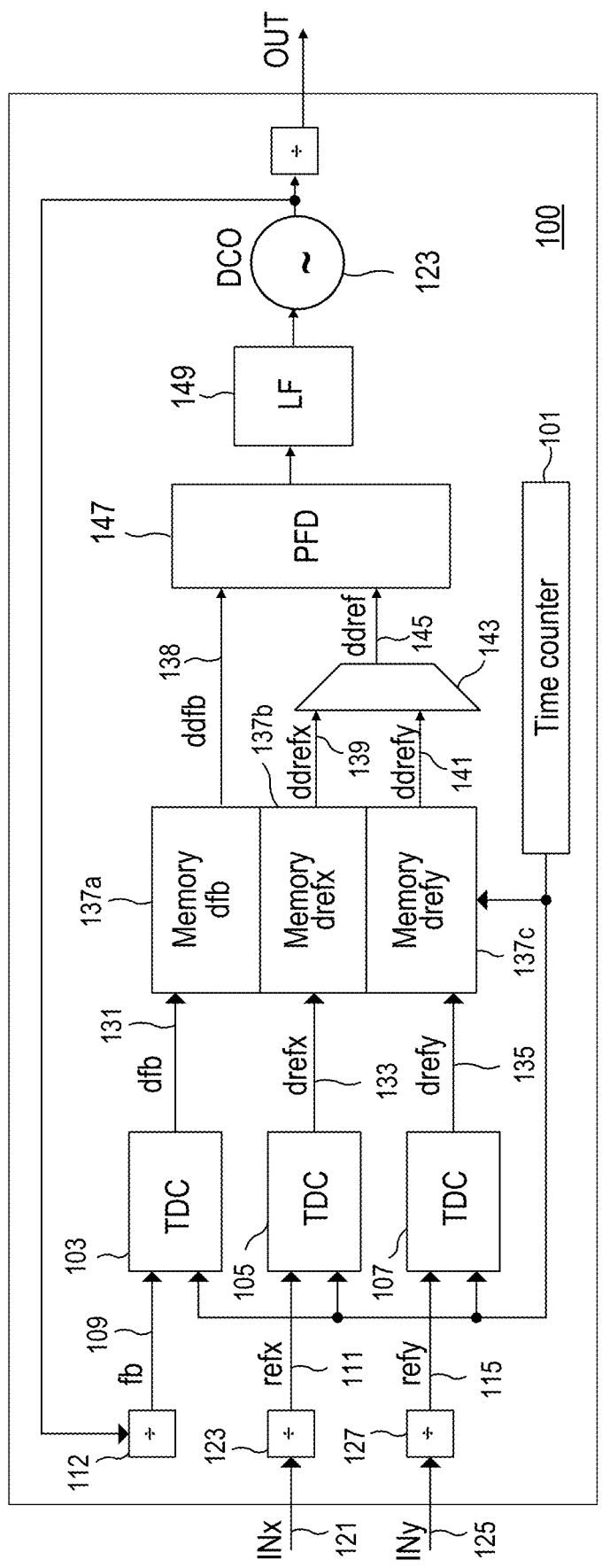
FIG. 1 illustrates a block diagram of a PLL according to an embodiment.

A PLL system uses time-to-digital conversion and memory to provide a delay with high resolution and large delay range. In embodiments described herein, time-to-digital conversion is the process of sampling a 'time' counter (preferably high resolution) with a transition of a clock signal to generate a digital representation of the time of occurrence of the clock edge with high resolution. Referring to FIG. 1, in PLL 100, time to digital converters (TDCs) 103, 105, and 107 sample the 'time counter' 101 using clocks signals supplied to the TDCs. The TDCs sample the time counter 101 using, respectively, the feedback clock (fb) signal 109, the reference clock signal (refx) 111, and the reference clock signal (refy) 115. In the embodiment shown in FIG. 1, the PLL receives the reference clock INx 121, which is divided down in divider 123 to generate refx 111. The PLL 100 also receives the reference clock INy 125, which is divided down in divider 127 to generate refy 115. The feedback divider 112 receives the output of the digitally controller oscillator (DCO) 123 and generates the feedback clock 109.

TDC 103 samples the time counter 101 with fb clock signal 109 and generates the digital feedback clock signal digital code (dfb) 131 that represents when the edge of the feedback clock signal 109 occurs in the time base represented by the time counter 101. In embodiments, the TDC 103 generates a digital code for only the active edge, e.g., the rising edge or the falling edge of the feedback clock signal 109. In other embodiments, both edges are used to sample the time counter 101 and digital codes for both edges are generated. TDC 105 samples the time counter 101 with refx 111 and generates a digital refx code (drefx) 133 that represents when the edge of the refx clock signal 111 occurs in the time base represented by the time counter 101. In embodiments, the TDC 105 generates a time code for only the active edge, e.g., the rising edge or the falling edge of the refx clock signal 111. In other embodiments, time codes for both edges are generated. TDC 107 samples the time counter 101 with refy 115 and generates a digital refy code (drefy) 135 that represents when the edge of the refy clock signal 115 occurs in the time base represented by the time counter 101. In embodiments, the TDC 107 generates time codes for only the active edge, e.g., the rising edge or the falling edge of the refy clock signal 115. In other embodiments, time codes for both edges are generated.

The digital codes from the TDCs are enqueued (stored in a queue) in memories 137a, 137b, and 137c as the digital codes become available from the TDCs. However, the digital codes are dequeued (removed) from the memory only after the desired delay (in 'time counter' time) has elapsed. Since the 'time counter' has high resolution, the delay has a high precision. For example, high resolution TDCs can generate digital codes with picosecond (ps) resolutions. Other embodiments can of course utilize other TDC resolutions. An example of a high resolution TDC can be found in U.S. Pat. No. 10,067,478, naming Raghunandan Kolar Ranganathan as inventor, entitled "Use of A Recirculating Delay Line With a Time-To-Digital Converter, issued Sep. 4, 2018, which application is incorporated herein by reference in its entirety. The range of the delay depends on the amount of memory used to implement the queue. The larger the memory, the larger the range of delay. FIG. 1 shows the memory as three separately managed memory structures 137a, 137b, and 137c to allow for separate read and write controls for each memory thereby allowing the memories to be written and read simultaneously. Other embodiments use a multi-port memory to allow simultaneous writing and reading to the memory. Assuming separate memories for each TDC, each memory utilizes a conventional first in first out (FIFO) structure, including a head pointer that points to the front of the queue (the oldest digital code in the memory) and a tail pointer pointing the back of queue (the newest digital code enqueued in the memory). When a digital code is dequeued, the head pointer is incremented to point to what was the next oldest digital code in the queue. When a digital code is placed in the queue, it is placed after the newest digital code in the queue.

The memory 137a supplies the delayed digital feedback clock signal (ddfb) 138. The memory 137b supplies the delayed digital refx code (ddrefx) 139 and the memory 137c supplies the delayed digital refy code (ddrefy) 141. Multiplexer 143 selects one of the delayed digital codes reference codes, ddrefy or ddrefx, as the delayed digital reference clock digital code (ddref) 145, which is supplied, along with ddfb 138, to the phase and frequency detector (PFD) 147, which in turn supplies the loop filter 149. Note that even though one of the delayed digital reference clocks ddrefx or ddrefy is not being selected as a reference clock, in embodiments the TDC associated with the clock signal still samples the time counter, generates digital codes, which are queued and dequeued the same as if the reference clock signal were the selected reference clock signal. By keeping the queuing and dequeuing of the non-selected reference clock active allows a faster transition should a problem be detected with the selected reference clock signal.

Figure 2:
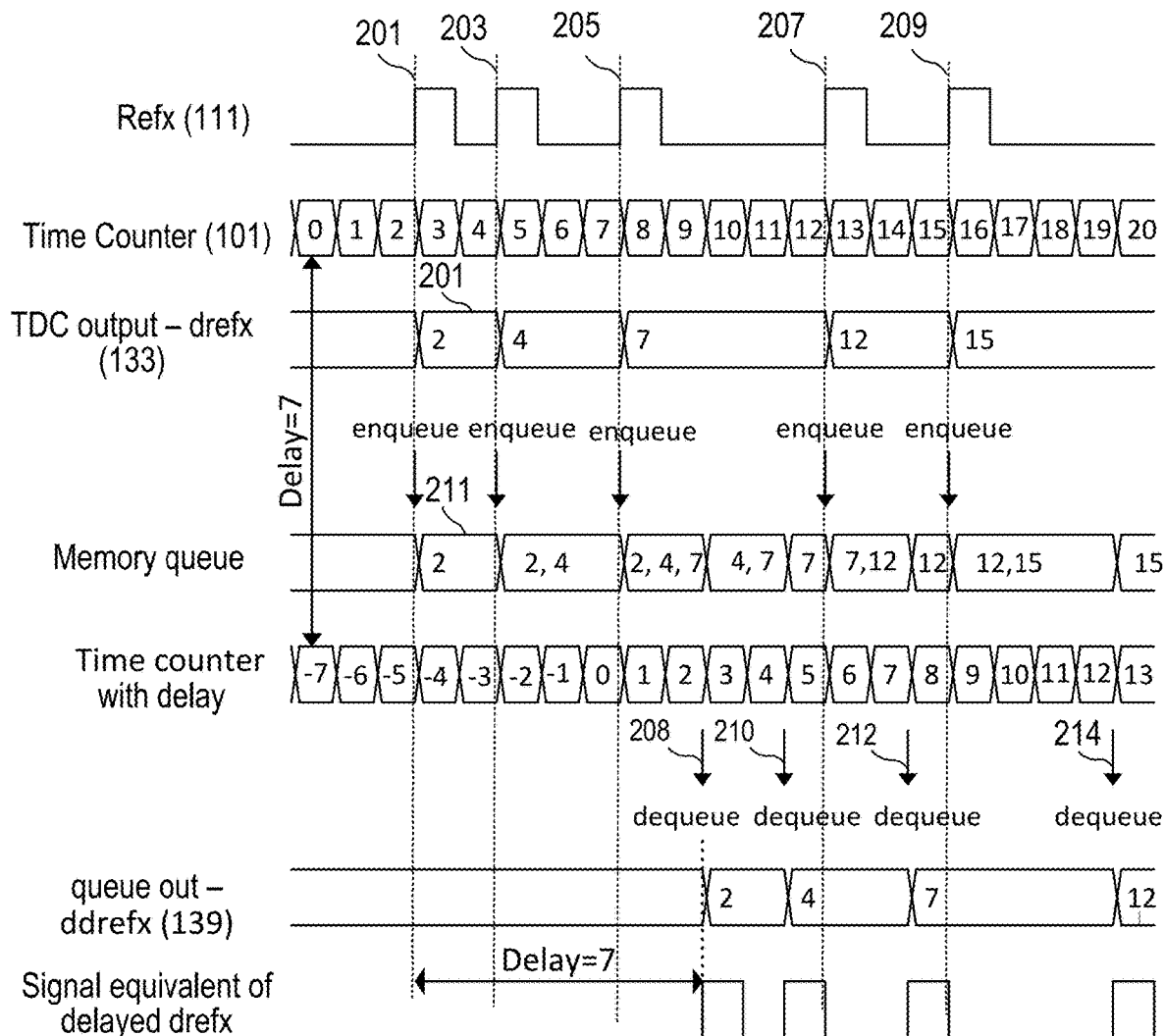
FIG. 2 illustrates a timing diagram illustrating how digital codes representing clock signals can be delayed using a memory.
Figure 3:
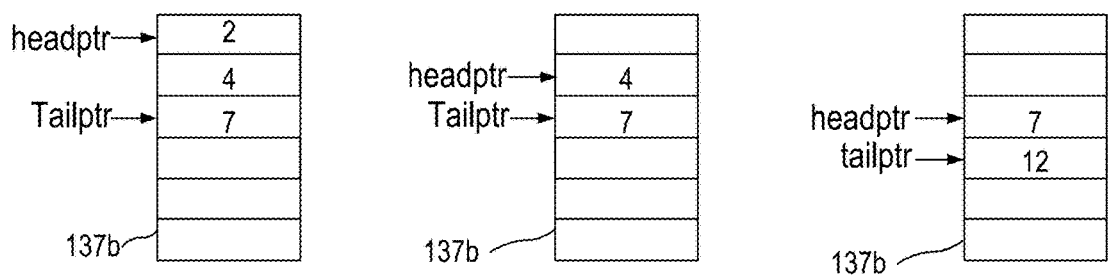
FIG. 3 illustrates operation of the queuing and dequeuing of time codes.

FIG. 2 illustrates operation of one embodiment for sampling of the time counter using the reference clock signal refx and queuing and dequeuing of time codes resulting from the sampling. Referring to FIGS. 1 and 2, TDC 105 uses the input clock signal refx 111 to sample the time counter 101. FIG. 2 shows the time counter value starting at 0. The rising edge of refx at 201 samples the time counter value of 2, which is supplied as the digital code drefx 133 at the TDC output. The sampled value of 2 is enqueued in the memory at 201 as shown in the memory queue at 211. In the embodiment illustrated in FIG. 2, the delay is 7 time counter units. The 'time counter with delay' shown in FIG. 2 is the time counter with the programmed delay subtracted out. Thus, e.g., when the time counter 101 has a value 2, the time counter with delay has a value of −5. The rising edge of the refx clock signal at 203 causes the value 4 to be sampled from the time counter and enqueued in the memory. The rising edge of the refx clock signal at 205 causes the value 7 to be sampled from the time counter and enqueued in the memory. At that point the memory holds the digital codes 2, 4, and 7 corresponding to the rising edges of refx. Additional values are enqueued at 207 and 209. FIG. 3 shows a view of the memory 137b starting at time 205. The head pointer points to the front of the queue, which has a value of 2, and the tail pointer points to the back of the queue having the value of 7.

The signal codes are dequeued out of the memory only when the digital code matches the value of 'time counter with delay'. As shown in FIG. 2, the value 2 is dequeued out of memory when the code 2 matches the 'time counter with delay' at 208. The head pointer of the queue then points to the value 4 as shown in FIG. 3, the oldest digital code in the memory, which is dequeued at 210. As the time counter value 12 is enqueued and the queue value 4 is dequeued the head pointer and tail pointer point to 7 and 12 respectively. The digital codes 7 and 12 are dequeued at 212 and 214 respectively. The memory supplies the dequeued digital codes ddrefx 139 as shown in FIG. 2. FIG. 2 shows the signal equivalent of the delayed digital refx code, which can be seen to be the same as refx 111 delayed by 7 time counter units. The range of delay is based on the size of the memory and the frequency of the reference clock signals.

While FIGS. 2 and 3 illustrate the timing for refx, similar enqueueing and dequeuing occurs for the feedback signal 109 with TDC 103 and memory 137a and for the refy signal 115, TDC 107 and the memory 137c. The delay for each of the clock signals is typically the same. The delay provided by the use of the TDCs and the memory to supply ddfb, ddrefx and ddrefy allows the PLL to check for degradation of the reference clocks in phase or frequency and even loss of signal by detecting them on INx, INy, refx, refy, drefx and drefy, allowing the PLL to switch to the better reference clock signal, thereby reducing the likelihood that degradation or loss of signal will adversely affect the output from the DCO 123.

Figure 4:
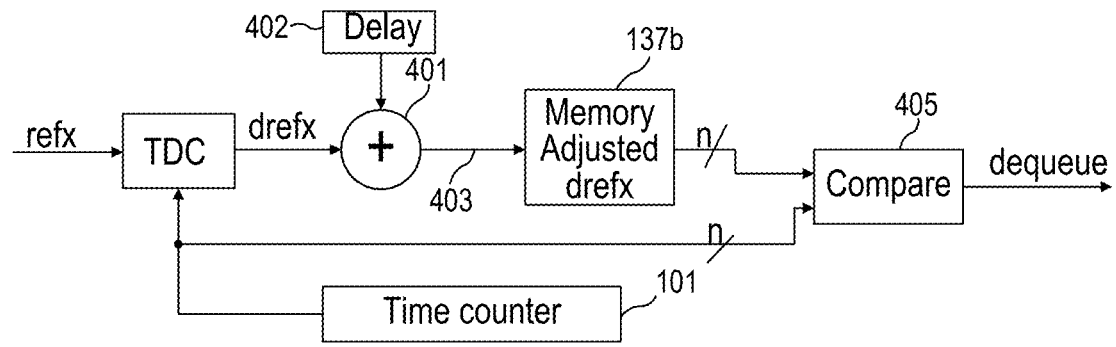
FIG. 4 illustrates an embodiment for determining when to dequeue a digital code from the memory.

Since dequeuing the signal codes out of memory is done by comparing the value in the memory queue against the 'time counter with delay', the comparison can be implemented in multiple mathematically equivalent ways. FIG. 4 illustrates an embodiment in which the value of the delay, e.g., '7' is added to the digital code drefx in summer 401 to generate an adjusted drefx 403 before being enqueued in memory 137*b*. The adjusted time code value is delayed in memory until the adjusted time code value is at the front of the queue and compare function 405 determines that the adjusted time code value matches the time count value. For example, if drefx=2, with a delay of 7, adjusted drefx=9. The digital code 9 is dequeued when compare function 405 indicates that the time counter value matches the enqueued adjusted drefx value by asserting the dequeue signal.

Figure 5:
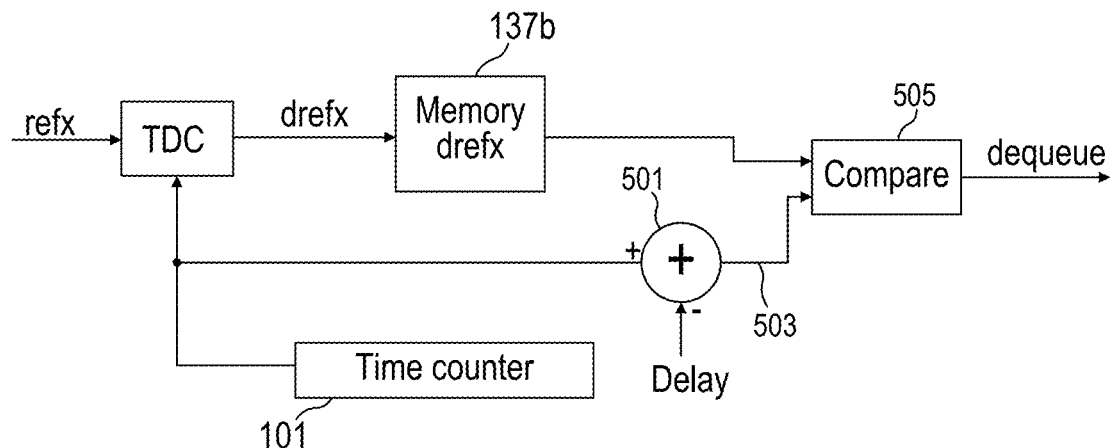
FIG. 5 illustrates an embodiment for determining when to dequeue a digital code from the memory.

FIG. 5 illustrates another approach in which the value of the delay is subtracted from the time counter value in subtraction circuit 501 to generate an adjusted time counter value 503, which is compared to the value at the front of the queue in comparator 505. For example, with a delay of 7, assume the value 2 is enqueued in memory and at the front of the queue. When the time counter value is 9, subtracting 7 results in the adjusted time counter value matching the value 2 enqueued at the head of the queue and a dequeue signal is generated to supply a dequeued signal code to the multiplexer 143.

Figure 6:
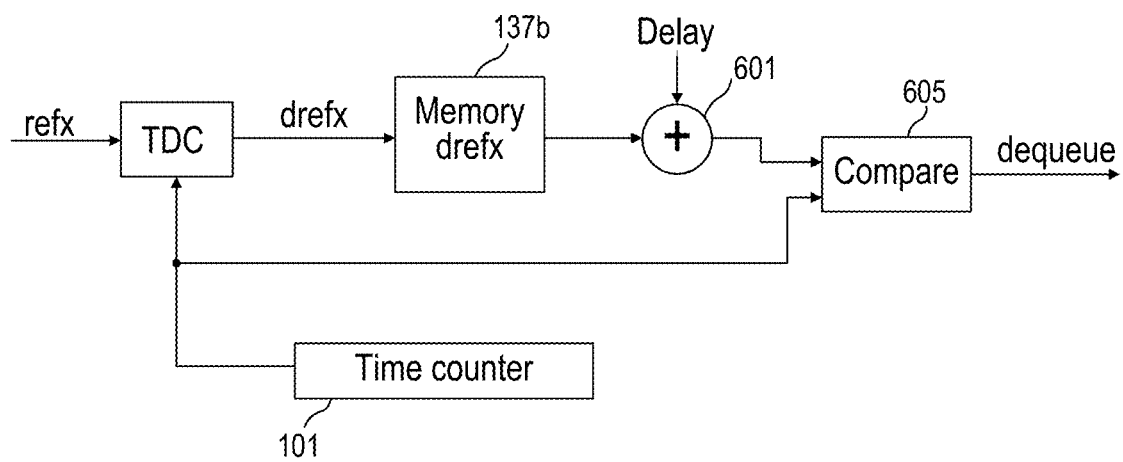
FIG. 6 illustrates an embodiment for determining when to dequeue a digital code from the memory.

FIG. 6 illustrates another approach that adds the delay to the signal code that is at the front of the memory queue in summer 601 and then compares the resultant sum against the 'time counter' in compare logic 605 to determine whether to dequeue the time code at the front of the queue. For example, if the head of the queue has a value of 2 and the delay is 7, a dequeue occurs when the time counter equals 9. Thus, there are many equivalent ways to determine when to dequeue the front of the queue. That is, there are many ways to determine when the appropriate amount of delay has occurred. The delay value may be programmable or fixed. For example, the delay value may be stored in volatile or non-volatile memory 402 (see FIG. 4) and programmed via a communication interface (not shown in FIG. 4).

Figure 7:
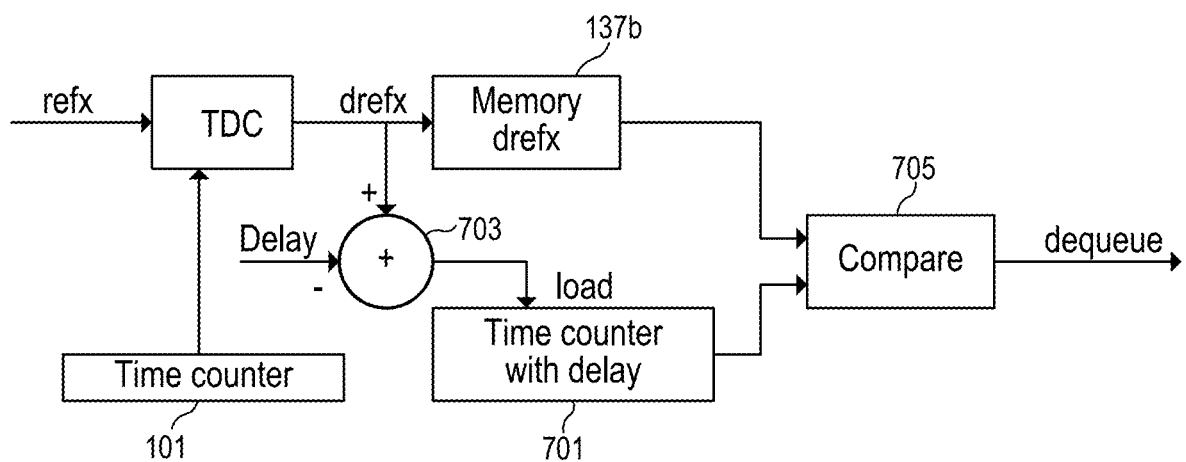
FIG. 7 illustrates an embodiment for determining when to dequeue a digital code from the memory using an additional counter.

Since the 'time counter with delay' is just a mathematically different version of the 'time counter' running at the same rate, the time counter can also be implemented in multiple ways. For example, referring to FIG. 7, the first signal code can be used as the starting value for a 'time counter with delay' 701 that is running at the same rate as the 'time counter' 101. Since drefx is the value of 'time counter' when refx sampled, that value can be loaded into a 'time counter with delay' 701 after subtracting out the delay in subtraction circuit 703. For example, assume the first signal code for drefx is 2 and the delay is 7. The 'time counter with delay' 701 is loaded with −5 and then counts at the same rate as 'time counter'. Comparator 705 compares the contents of the 'time counter with delay' to the front of the queue in memory 137*b* to determine when to dequeue the front of the queue.

Thus, various aspects have been described related to delaying clock signals using TDCs in a phase-locked loop.

While various embodiments apply the delay mechanism to PLLs, delay approach described herein can be used in various applications other than PLLs where delaying a signal is useful. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method of operating a phase-locked loop comprising:
    converting first and second edges of a clock signal to first and second digital values corresponding to the first and second edges, respectively;
    storing the first and second digital values in a memory;
    determining when a first period of delay has been reached for first and second digital values using first and second current count values from a counter, respectively;
    responsive to a first input compare value based on the first digital value matching a second input compare value based on the first current count value, outputting the first digital value from the memory after a first period of delay elapses following the first edge of the clock signal;
    responsive to a third input compare value based on the second digital value matching a fourth input compare value based on the second current count value from the counter, outputting the second digital value from the memory after the first period of delay elapses following the second edge of the clock signal; and
    sequentially receiving and processing the first and second digital values output from the memory using a phase and frequency detector of the phase-locked loop.

2. The method of claim 1 wherein the first input compare value is the first digital value adjusted by the first period of delay.

3. The method of claim 1 wherein the first input compare value is the first digital value and the second input compare value is the first current count value adjusted by the first period of delay.

4. The method of claim 1 wherein the first period of delay is programmable.

5. The method of claim 1 wherein the clock signal is a reference clock signal supplied to the phase-locked loop or the clock signal is a feedback clock signal of the phase-locked loop.

6. The method of claim 1 wherein the first and second edges are both rising edges or both falling edges.

7. A phase-locked loop comprising:
    a first time-to-digital converter configured to convert edges of a first clock signal to first digital values, and a second time-to-digital configured to convert edges of a second clock signal to second digital values;
    at least one memory coupled to the first and second time-to-digital converters and configured to store the first and second digital values in first and second queues within the memory, respectively, and to output each respective value of the first and second digital values after a period of delay elapses after writing the respective value to the memory; and
    a phase and frequency detector coupled to the memory; and
    a counter circuit used to generate the first digital values and second digital values.

8. The phase-locked loop of claim 7 further comprising first compare logic to compare a first compare input based on a front of the first queue to a second compare input based on a first current value of the counter circuit, the front of the first queue dequeued responsive to the first compare logic indicating that the first compare input is equal to the second compare input, and second compare logic to compare a third compare input based on a front of the second queue to a fourth compare input based on a second current value of the counter circuit, the front of the second queue dequeued responsive to the second compare logic indicating that the third compare input is equal to the fourth compare input.

9. The phase-locked loop of claim 7 wherein the period of delay is the same for both the first and second digital values.

10. The phase-locked loop of claim 7 wherein the first clock signal is a reference clock signal supplied to a phase-locked loop and the second clock signal is a feedback clock signal.

11. The phase-locked loop of claim 7 wherein the period of delay is programmable.

12. A phase-locked loop comprising:
a first time-to-digital converter configured to convert edges of a first clock signal to first digital values, and a second time-to-digital configured to convert edges of a second clock signal to second digital values;
at least one memory coupled to the first and second time-to-digital converters and configured to store the first and second digital values in first and second queues within the memory, respectively, and to output each respective value of the first and second digital values after a period of delay elapses after writing the respective value to the memory; and a phase and frequency detector coupled to the memory;
a phase and frequency detector coupled to the memory; and
a third time-to-digital converter coupled to a feedback clock signal and configured to convert edges of the feedback clock signal to third digital values, the memory further configured to store the third digital values in a third queue and to output each respective value of the third digital values after a period of delay elapses after writing the respective value to the memory.

13. The phase-locked loop of claim 12 further comprising a counter circuit used to generate the first digital values and second digital values.

14. The phase-locked loop of claim 12 wherein the period of delay is the same for the first digital values, the second digital values, and the third digital values.

15. The phase-locked loop of claim 12 wherein the first clock signal is a first reference clock signal, the second clock signal is a second reference clock signal, and the third clock signal is a feedback clock signal.

16. A phase-locked loop comprising:
a counter circuit;
a first time-to-digital converter configured to use an output of the counter circuit to convert edges of a first reference clock signal to first digital values, and a second time-to-digital configured to convert edges of a second reference clock signal to second digital values;
at least one memory coupled to the first and second time-to-digital converters and configured to store the first and second digital values in first and second queues within the memory, respectively, and to output each respective value of the first and second digital values after a period of delay elapses after writing the respective value to the memory; and
reference clock selection logic coupled to the memory and configured to selectively output either the first digital values or the second digital values;
a phase and frequency detector coupled to an output of the reference clock selection logic; and
a third time-to-digital converter coupled to a feedback clock signal and configured to convert edges of the feedback clock signal to third digital values, the memory further configured to store the third digital values in a third queue and to output each respective value of the third digital values after a period of delay elapses after writing the respective value to the memory.

17. The phase-locked loop of claim 16 wherein the period of delay is the same for the first digital values, the second digital values, and the third digital values.

18. The phase-locked loop of claim 16 wherein the period of delay is programmable.

* * * * *